(12) United States Patent
Utsuno

(10) Patent No.: US 7,923,997 B2
(45) Date of Patent: Apr. 12, 2011

(54) MAGNETO-SENSITIVE INTEGRATED CIRCUIT

(75) Inventor: Kikuo Utsuno, Miyazaki (JP)

(73) Assignees: Oki Micro Design Co., Ltd., Miyazaki (JP); Denso Corporation, Aichi (JP)

( * ) Notice: Subject to any disclaimer, the term of this patent is extended or adjusted under 35 U.S.C. 154(b) by 462 days.

(21) Appl. No.: 12/138,567

(22) Filed: Jun. 13, 2008

(65) Prior Publication Data

US 2009/0009164 A1   Jan. 8, 2009

(30) Foreign Application Priority Data

Jun. 14, 2007   (JP) ................... 2007-157469

(51) Int. Cl.
 G01R 33/07 (2006.01)
 H01L 43/06 (2006.01)
 H03K 17/78 (2006.01)
(52) U.S. Cl. .............. 324/251; 324/207.2; 327/511
(58) Field of Classification Search .......... 324/207.2, 324/251, 207.21, 252; 338/32 H, 32 R; 257/421; 327/510, 511
See application file for complete search history.

(56) References Cited

U.S. PATENT DOCUMENTS

| 5,604,433 | A | * | 2/1997 | Theus et al. | 324/251 |
| 5,844,427 | A | * | 12/1998 | Theus et al. | 327/51 |
| 6,154,027 | A | * | 11/2000 | Alexander et al. | 324/251 |
| 6,532,436 | B2 | * | 3/2003 | Motz | 702/189 |
| 6,636,033 | B2 | * | 10/2003 | Draxelmayr | 324/166 |
| 6,674,322 | B2 | * | 1/2004 | Motz | 330/9 |
| 6,957,173 | B2 | * | 10/2005 | Motz | 702/189 |
| 7,479,826 | B2 | * | 1/2009 | Yoshizawa et al. | 330/9 |
| 7,492,149 | B2 | * | 2/2009 | Motz et al. | 324/207.2 |
| 2007/0114988 | A1 | * | 5/2007 | Rossmann et al. | 324/207.2 |
| 2008/0265880 | A1 | * | 10/2008 | Nishikawa | 324/251 |

FOREIGN PATENT DOCUMENTS

| JP | 6-103341 | 4/1994 |
| JP | 2001-337147 | 12/2001 |

* cited by examiner

Primary Examiner — Kenneth J Whittington
(74) Attorney, Agent, or Firm — Volentine & Whitt, P.L.L.C.

(57) ABSTRACT

A magneto-sensitive integrated circuit which amplifies a magneto-sensitive output voltage of a Hall element by an amplifier to generate an amplified voltage, converts an output voltage of the amplifier into a digital signal by an A/D converter; and generates a reference voltage of magnitude corresponding to an indicated value. The amplifier includes a voltage superposition element which superposes a DC voltage corresponding to the reference voltage on the amplified voltage to generate the output voltage of the amplifier.

10 Claims, 14 Drawing Sheets

FIRST STEP → SECOND STEP

OFFSET VOLTAGE - TEMPERATURE CHARACTERISTIC OF HALL ELEMENT
(DRIVING AT CONSTANT CURRENT)

FIG.11

CORRESPONDENCE BETWEEN MEASURED TEMPERATURE BY TEMPERATURE MEASUREMENT SECTION AND TEMPERATURE DETECTION SIGNAL

| MEASURED TEMPERATURE [°C] | TEMPERATURE DETECTION SIGNAL (HEXADECIMAL NOTATION) |
|---|---|
| −106.000 | 8000 |
| −89.625 | 9000 |
| −73.250 | A000 |
| −56.875 | B000 |
| −40.500 | C000 |
| −24.125 | D000 |
| −7.750 | E000 |
| 8.625 | F000 |
| 25.000 | 0000 |
| 41.375 | 1000 |
| 57.750 | 2000 |
| 74.125 | 3000 |
| 90.500 | 4000 |
| 106.875 | 5000 |
| 123.250 | 6000 |
| 139.625 | 7000 |
| 156.000 | 7FFF |

FIG.12

TEMPERATURE DETECTION SIGNAL (UPPER FOUR BITS)   CORRECTION VALUE TRUTH TABLE

|  | TEMPERATIRE CHARCTERISTIC CORRECTION FACTOR | | | | | | |
| --- | --- | --- | --- | --- | --- | --- | --- |
|  | -3 | -2 | -1 | 0 | 1 | 2 | 3 |
| 8h | 3 | 2 | 1 | 0 | -1 | -2 | -3 |
| 9h | 3 | 2 | 1 | 0 | -1 | -2 | -3 |
| Ah | 3 | 2 | 1 | 0 | -1 | -2 | -3 |
| Bh | 3 | 2 | 1 | 0 | -1 | -2 | -3 |
| Ch | 3 | 2 | 1 | 0 | -1 | -2 | -3 |
| Dh | 3 | 2 | 1 | 0 | -1 | -2 | -3 |
| Eh | 0 | 0 | 0 | 0 | 0 | 0 | 0 |
| Fh | 0 | 0 | 0 | 0 | 0 | 0 | 0 |
| 0h | 0 | 0 | 0 | 0 | 0 | 0 | 0 |
| 1h | -3 | -2 | -1 | 0 | 1 | 2 | 3 |
| 2h | -6 | -4 | -2 | 0 | 2 | 4 | 6 |
| 3h | -9 | -6 | -3 | 0 | 3 | 6 | 9 |
| 4h | -12 | -8 | -4 | 0 | 4 | 8 | 12 |
| 5h | -15 | -10 | -5 | 0 | 5 | 10 | 15 |
| 6h | -18 | -12 | -6 | 0 | 6 | 12 | 18 |
| 7h | -21 | -14 | -7 | 0 | 7 | 14 | 21 |

MAGNETO-SENSITIVE INTEGRATED CIRCUIT

BACKGROUND OF THE INVENTION

1. Field of the Invention

The present invention relates to a magneto-sensitive integrated circuit such as a Hall IC (integrated circuit) for outputting an electric signal in response to an applied magnetic field.

2. Description of the Related Background Art

If a magnetic field is generated in a direction passing through the principal plane of a Hall element by flowing a current (or applying a voltage) between the input terminals of the Hall element, electrons within the element are bent in the travel direction owing to a Lorenz's force, so that a potential VH occurs between the output terminals. This phenomenon is called a Hall effect, and the potential VH is called a Hall voltage. The Hall voltage VH can be represented by the following expression.

$$VH = K*I*B \quad (1)$$

In this way, the Hall element can produce a voltage proportional to a control current I and a magnetic flux density B of the applied magnetic field. Where K is a Hall element intrinsic value, which is different with the material or shape. The Hall IC is an element in which a Hall element, an amplifier for amplifying the output voltage of the Hall element, and an A/D converter for converting the output voltage of the amplifier into a digital signal are formed in one package, and usable for a contactless switch, rotation detection, position detection and so on.

An offset voltage VOS that is one of the basic characteristics of the Hall element is a voltage occurring between the output terminals only by flowing a current (or applying a voltage) between the input terminals when there is no magnetic field. That is, a sum of the offset voltage VOS and the Hall voltage VH is outputted as a Hall element output voltage VOUT between the output terminals of the Hall element when measuring the magnetic field.

Referring to FIG. 1, a principle of generating the offset voltage VOS will be described below. An equivalent circuit of the Hall element can be represented by a resistor bridge circuit as shown in FIG. 1. A Hall element output voltage VOUT that occurs between the VP-VN terminals when an input voltage Vin is applied between the Vin-Vs terminals in a state with no magnetic field is $$VOUT = VOS = \{R4/(R1+R4) - R3/(R2+R3)\} * Vin \quad (2).$$

If all the resistance values R1 to R4 of four elements forming the bridge are equal, VOUT=0. That is, in this case, the offset voltage VOS is 0. On the other hand, if the resistance values of R1 to R3 are r, and only the resistance value of R4 is r+a, the above expression (2) is solved such that, $$VOUT = VOS = [a/(4r+2a)] * Vin \quad (3)$$

whereby the output voltage is generated, irrespective of no magnetic field. That is, the resistance values of four elements making up the bridge are dispersed due to the manufacturing reason, in which its unbalance causes an offset voltage. The offset voltage VOS is almost equal to or more than the Hall voltage VH to be measured, whereby it is required to remove the offset voltage to obtain a correct signal according to the intensity of magnetic field.

A spinning current method, which is known as a method for removing the offset voltage, will be described below. The spinning current method is characterized by producing an output signal according to the intensity of magnetic field through the two step operation including a first step of applying a voltage between the A-A' terminals of the Hall element and measuring a Hall element output voltage VOUT1 occurring between the B-B' terminals, and a second step of applying a voltage between the B-B' terminals and measuring a Hall element output voltage VOUT2 occurring between the A-A' terminals, as shown in FIGS. 2A and 2B. That is, the spinning current method is a measurement method for producing the Hall element output voltage by exchanging an input terminal pair and an output terminal pair between the first step and the second step. Herein, if the resistance values of R1 to R3 are r and only the resistance value of R4 is r+a, an offset voltage VOS1 occurring at the first step is, $$VOS1 = [a/(4r+2a)] * Vin \quad (4)$$

from the above expressions (2) and (3). Since the Hall element output voltage VOUT1 occurring between the output terminals B-B' is the sum of the Hall voltage VH and the offset voltage VOS1, $$VOUT1 = VH + [a/(4r+2a)] * Vin \quad (5)$$

occurs between the output terminals B-B' at the first step. On the other hand, an offset voltage VOS2 occurring at the second step is $$VOS2 = [R1/(R1+R2) - R4/(R3+R4)] * Vin = -[a/(4r+2a)] * Vin \quad (6).$$

Since the Hall element output voltage VOUT2 occurring between the output terminals A-A' is the sum of the Hall voltage VH and the offset voltage VOS2, $$VOUT2 = VH - [a/(4r+2a)] * Vin \quad (7)$$

occurs between the output terminals A-A' at the second step. The Hall element output voltages VOUT1 and VOUT2 obtained at the first and second steps are stored in memory at the timings T1 and T2, respectively. And an adder circuit performs the addition of VOUT1+VOUT2, the result being obtained as the final output. That is, if VOUT1 and VOUT2 are added, 2VH is obtained from the expressions (6) and (7), whereby an output signal containing no offset voltage component can be obtained (refer to Japanese Patent Laid-Open No. 2001-337147 and Japanese Patent Publication No. 6-103341).

A Hall IC has an amplifier for amplifying the Hall element output voltage and an A/D converter for converting the amplifier output into a digital signal, in addition to a Hall element. FIG. 3 is a view showing the relationship between a Hall voltage and an A/D conversion effective area. To improve an A/D conversion precision of the A/D converter, it is required to increase a gain of the amplifier. Herein, since an input voltage of the A/D converter is required to be within an effective area where the A/D converter can perform the processing, it is required that the gain of the amplifier is set taking this into consideration. However, if the output voltage of the Hall element is amplified by the amplifier, not only the Hall voltage VH but also the offset voltage VOS are amplified, so that the gain of the amplifier can not be fully increased. As a result, the A/D conversion precision was not ensured, whereby it was difficult to achieve the sufficient magnetic field detection precision.

SUMMARY OF THE INVENTION

It is an object of the present invention to provide a magneto-sensitive integrated circuit capable of detecting a magnetic field at high precision by removing an offset voltage outputted from the Hall element.

The present invention provides a magneto-sensitive integrated circuit comprising: a Hall element which generates a magneto-sensitive output voltage corresponding to a magnetic flux density of an applied magnetic field; an amplifier which amplifies the magneto-sensitive output voltage to generate an amplified voltage; an A/D converter which converts an output voltage of the amplifier into a digital signal; and control means which generates a reference voltage of magnitude corresponding to an indicated value, wherein the amplifier includes voltage superposition means which superposes a DC voltage corresponding to the reference voltage on the amplified voltage to generate the output voltage of the amplifier.

According to the magneto-sensitive integrated circuit of the invention, since the offset voltage component of the Hall element contained in the amplifier output is removed, the amplifier gain can be increased, and accordingly the magnetic field detection with high precision can be achieved.

BRIEF DESCRIPTION OF THE DRAWINGS

FIG. 11 is a correspondence table between the measured temperature by a temperature measuring section and the temperature detection signal according to the embodiment of the invention.

FIG. 12 is a truth value table of the correction value according to the embodiment of the invention.

DETAILED DESCRIPTION OF THE INVENTION

The embodiments of the present invention will be described below with reference to the drawings. Throughout the drawings, the like or same components or parts are designated by the same reference signs.

First Embodiment

Figure 1:
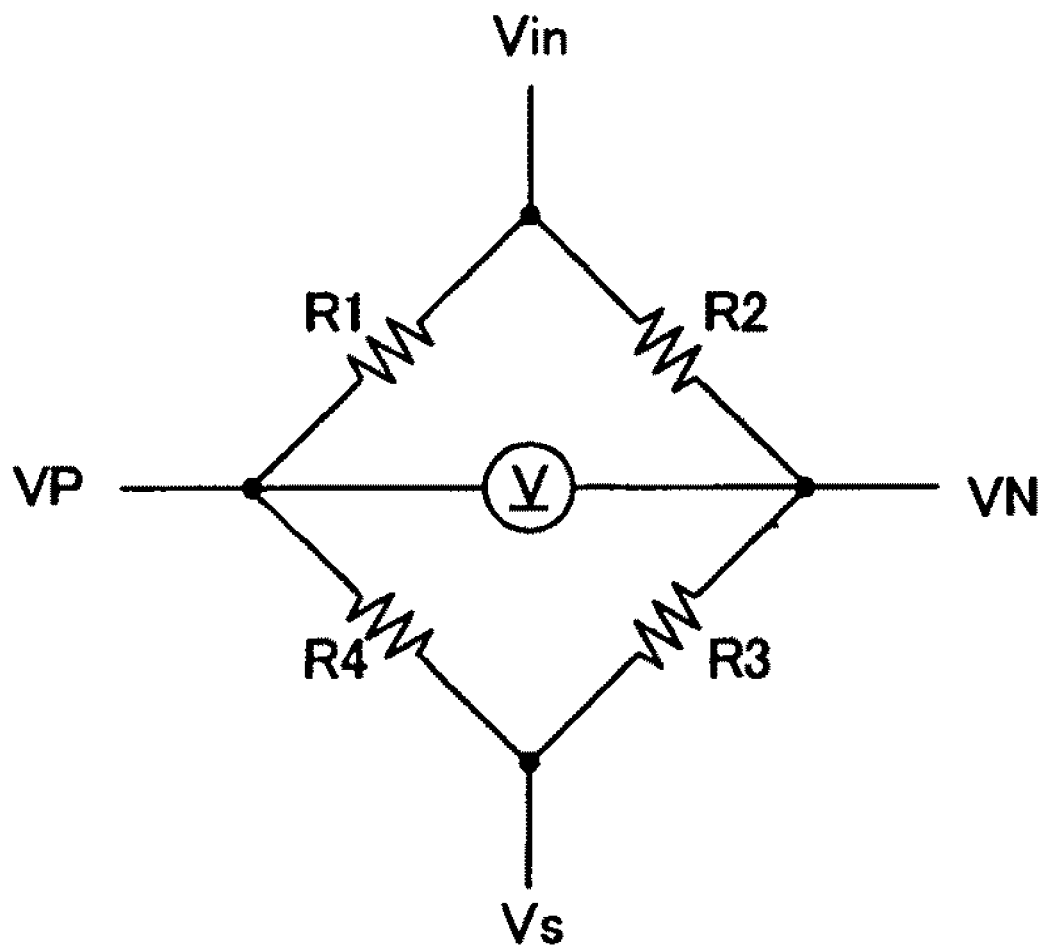
FIG. 1 is an equivalent circuit diagram of a Hall element.
Figure 2A:
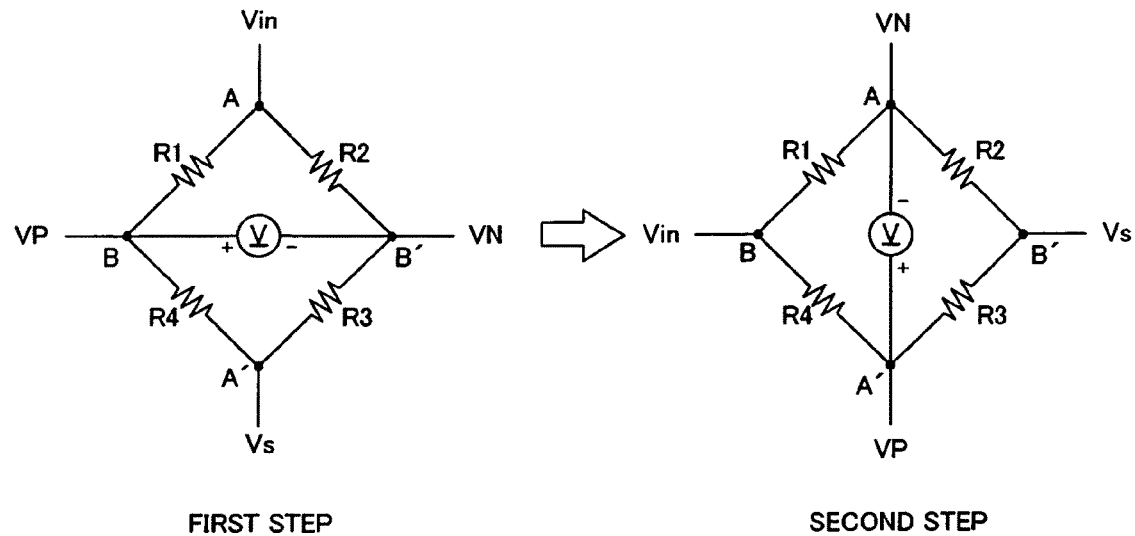
FIGS. 2A and 2B are diagrams showing the magnetic field measurement by a spinning current method.
Figure 2B:
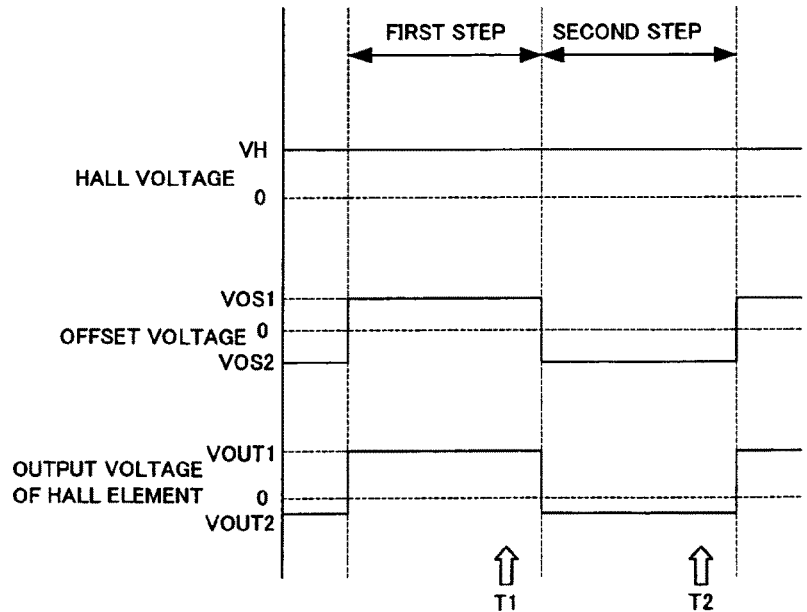
Figure 3:
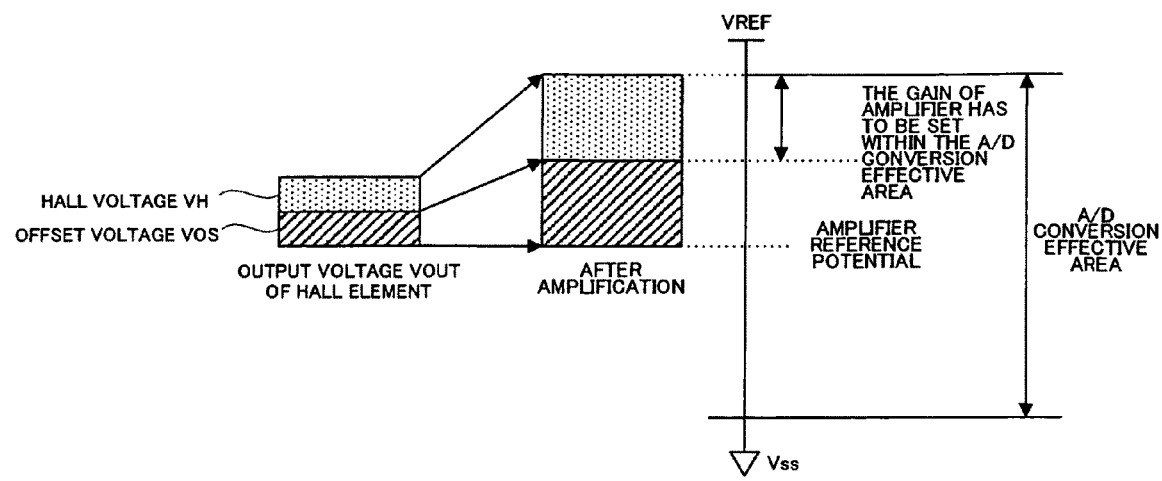
FIG. 3 is a view showing the relationship between the Hall voltage and the A/D conversion effective area.
Figure 4:
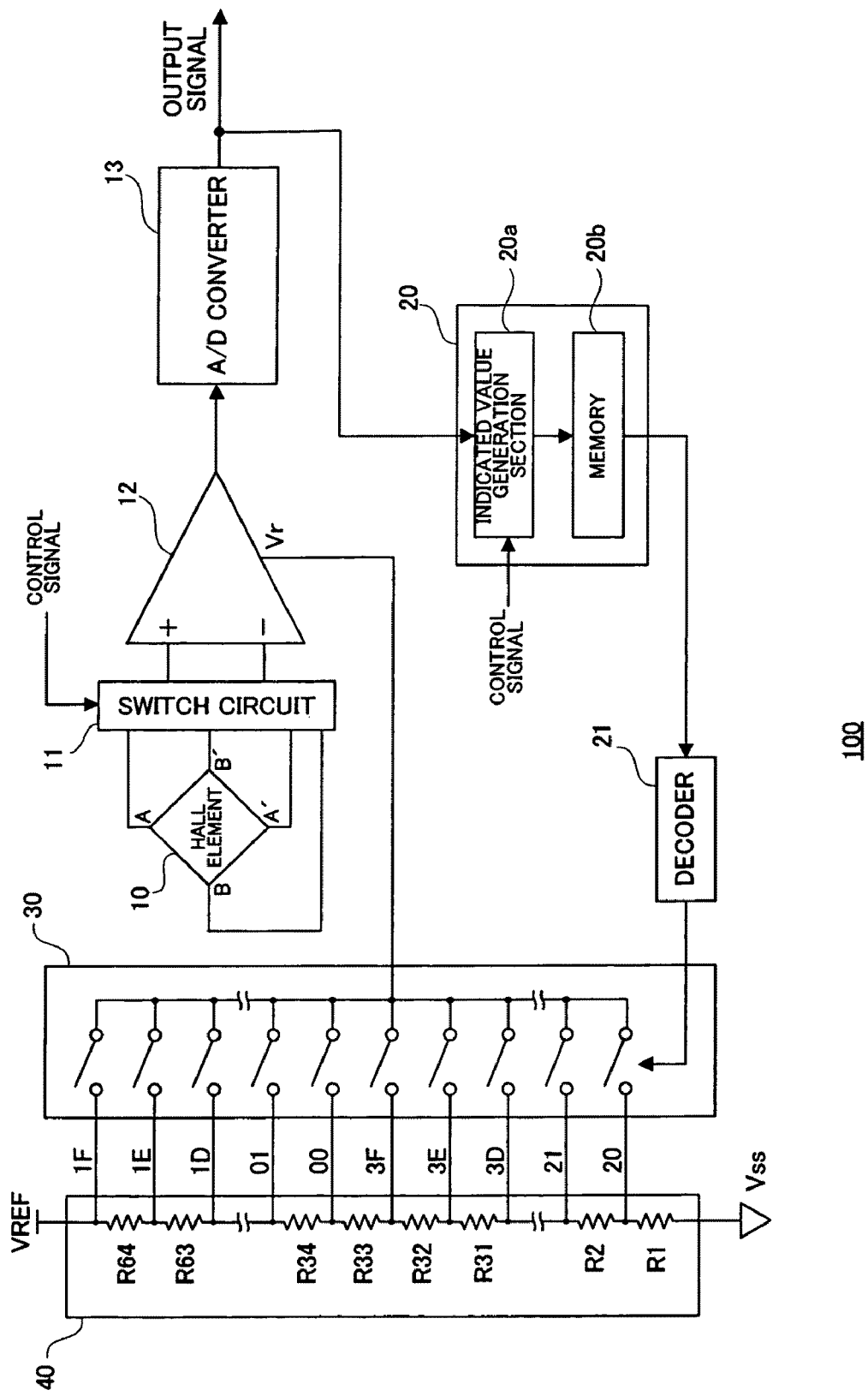
FIG. 4 is a block diagram showing the configuration of a Hall IC according to a first embodiment of the invention.

FIG. 4 shows the configuration of a Hall IC 100 according to a first embodiment of the invention. The Hall IC 100 comprises a Hall element 10, a switch circuit 11, an amplifier 12, an A/D converter 13, a control circuit 20, a decoder 21, a selector 30 and a resistor ladder circuit 40.

The Hall element 10 is the well-known Hall element formed of a semiconductor thin film made of Si, and having four terminals of A, A', B and B'.

The switch circuit 11 switches the connection between the amplifier 12 with a power source (not shown) for feeding electricity to the Hall element 10 and the Hall element 10 in accordance with a control signal supplied from the outside in detecting a magnetic field by a spinning current method. That is, the switch circuit 11, in accordance with the control signal, connects the power source (not shown) between the A-A' terminals of the Hall element and connects the terminals B and B' to a non-inverted input terminal and an inverted input terminal of the amplifier 12 respectively at the first step of the spinning current method, and connects the power source (not shown) between the B-B' terminals of the Hall element and connects the terminals A and A' to the non-inverted input terminal and the inverted input terminal of the amplifier 12 respectively at the second step.

The amplifier 12 is a differential amplifier to amplify a Hall element output voltage supplied via the switch circuit 11. The amplifier 12 has an additional voltage input terminal Vr, in which an additional voltage applied from the outside to this terminal is superposed as an output reference voltage of the amplifier 12 on the amplifier output. The Hall IC of the invention increases or decreases the additional voltage applied to the additional voltage input terminal Vr in accordance with an offset voltage of the Hall element 10 to remove an offset voltage component.

The additional voltage applied to the additional voltage input terminal Vr of the amplifier 12 is generated by the resistor ladder circuit 40. The resistor ladder circuit 40 has 64 resistors having the same resistance value connected in series, for example, in which a predetermined voltage VREF from the power source, not shown, is applied across the resistors connected in series. The reference voltage output terminals are provided at the respective ends of the resistors R1 to R64 making up the resistor ladder circuit 40, in which the voltage VREF is divided by these resistors to generate the reference voltages, and each reference voltage can be taken out of each of the reference voltage output terminals. Each reference voltage output terminal is given a terminal name for identifying each terminal. That is, the terminal name of each output terminal is represented in hexadecimal notation of two digits, in which the terminal name of the reference voltage output terminal nearest to VSS potential is "20", and the terminal name of up to the reference voltage output terminal 3F for outputting the mid-point potential 0.5*VREF is sequentially counted up in order of increasing output voltage. Also, the terminal name of the output terminal one stage above the reference voltage output terminal 3F is "00", and the terminal name of up to the terminal 1F for outputting the maximum potential VREF is counted up sequentially in order of increasing output voltage. The reference voltage output terminal 3F is the mid-point of the resistor ladder circuit 40. From this terminal, 0.5*VREF that is half of the voltage VREF is outputted, and this voltage is a normal value of the output reference voltage for the amplifier 12. That is, if the offset voltage is almost zero, the output reference voltage of the amplifier 12 is set to 0.5*VREF of the normal value.

The A/D converter 13 converts an output voltage of the amplifier 12 into a digital signal to output it as an output signal of the Hall IC 100. The output signal of the A/D converter 13 is also supplied to the control circuit 20, as will be described later.

The selector 30 is composed of a plurality of switches provided between the resistor ladder circuit 40 and the amplifier 12 and corresponding to the output terminals of the resistor ladder circuit 40, in which a voltage occurring at each reference voltage output terminal of the resistor ladder circuit 40 is selectively supplied to the additional voltage input terminal Vr of the amplifier 12 when the switch is driven.

The control circuit 20 comprises an indicated value generation section 20a for taking in the output signal of the A/D converter 13 in accordance with a control signal, selecting a voltage to be applied to the additional voltage input terminal Vr of the amplifier 12 from the reference voltage output terminals of the resistor ladder circuit 40, based on the output voltage of the amplifier 12 converted into the digital signal and generating an indicated value in accordance with the selected result, and a memory 20b for holding the operation result of the indicated value generation section 20a.

The decoder 21 reads the indicated value held in the memory 20b of the control circuit 20, and drives ON the switch of the selector 30 corresponding to the indicated value to connect the reference voltage output terminal of the resistor ladder circuit 40 selected by the indicated value generation section 20a and the additional voltage input terminal Vr of the amplifier 12.

Figure 5:
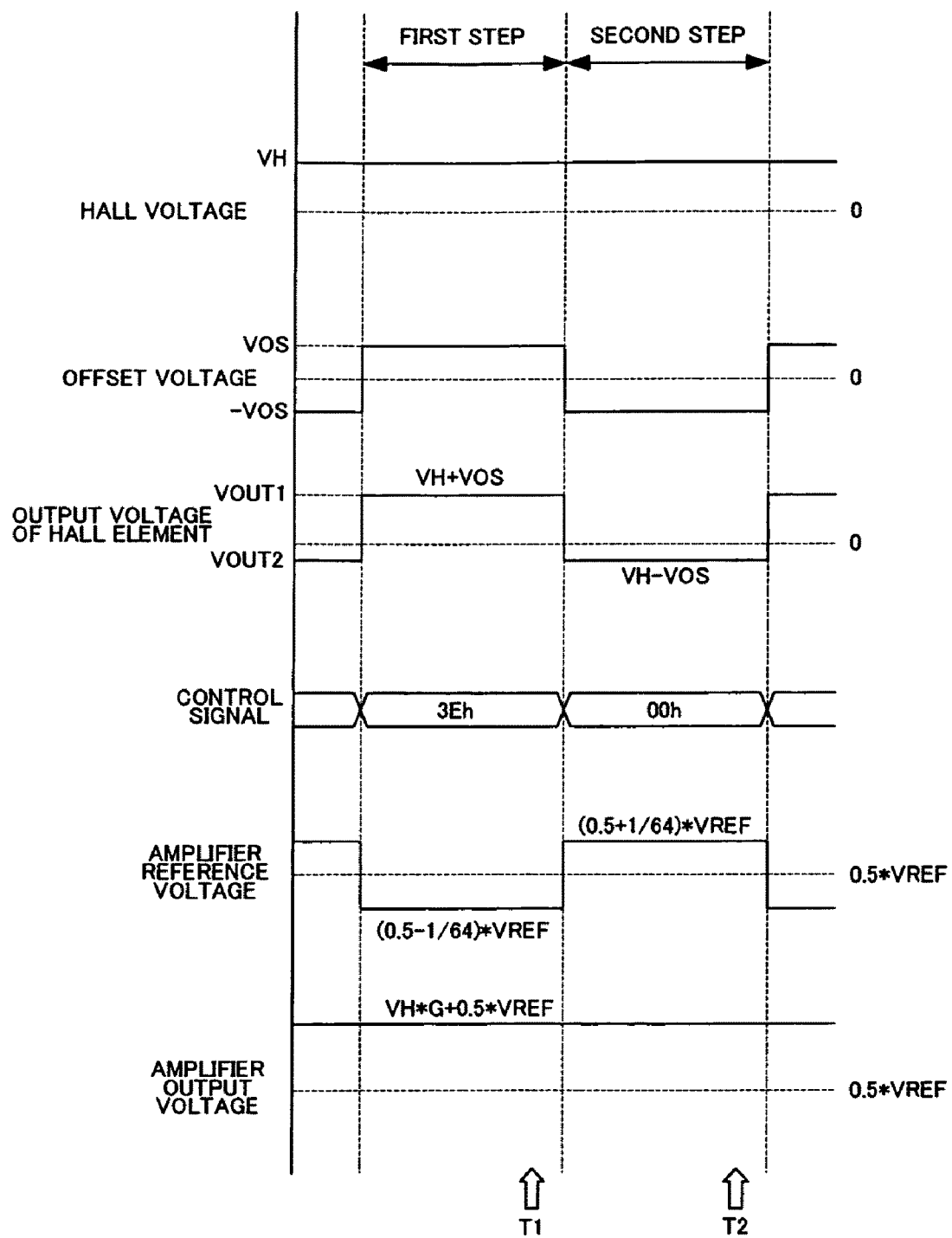
FIG. 5 is a timing chart showing the operation of the Hall IC according to the first embodiment of the invention.

Referring to a timing chart of FIG. 5, the operation of the Hall IC 100 having the above configuration will be described below. First of all, the control circuit 20 performs the following process to decide the indicated value to be stored in the memory 20b as the initial settings. The indicated value generation section 20a takes in an output signal of the A/D converter 13 and acquires an output voltage of the amplifier 12 converted into a digital signal, if a control signal is supplied from the outside in the environment where there is no magnetic field. That is, the amplifier output when there is no magnetic field is G*VOS, where the gain of the amplifier 12 is G, because the offset voltage VOS of the Hall element 10 is only amplified. The indicated value generation section 20a acquires this amplifier output voltage indicated by G*VOS from the output signal of the A/D converter 13. The indicated value generation section 20a selects two reference voltage output terminals generating the voltages closest to the voltages equivalent to a difference and a sum between the normal value of the output reference voltage and the voltage value equivalent to the amplifier output voltage indicated by the acquired G*VOS from among the reference voltage output terminals of the resistor ladder circuit 40 to remove the voltage equivalent to the acquired G*VOS as the offset component of the Hall element 10. That is, the indicated value generation section 20a selects two reference voltage output terminals generating the voltages closest to 0.5*VREF±G*VOS, generates two indicated values corresponding to these two terminals and stores them in the memory 20b. In the following description, it is supposed that $$G*VOS = \tfrac{1}{64}*VREF \tag{8}$$

and the control circuit 20 selects the reference voltage output terminal 3E generating a voltage of 0.5*VREF−1/64*VREF and the reference voltage output terminal 00 generating a voltage of 0.5*VREF+1/64*VREF to remove the offset voltage VOS*G after amplification in accordance with the initialization process, and holds the corresponding values 3 Eh and 00 h as the indicated values in the memory 20b.

In this embodiment, since the magnetic field is detected through the two step operation by a spinning current method as will be described later, two indicated values are generated. However, if the magnetic field is not detected by the spinning current method, one indicated value may be sufficient, in which only the reference voltage output terminal generating the voltage closest to 0.5*VREF−G*VOS is selected by the indicated value generation section 20a, and the indicated value corresponding to the selected reference voltage output terminal is generated and held in the memory 20b.

If the offset voltage of the Hall element 10 is near zero, the control circuit 20 selects the reference voltage output terminal 3F of the resistor ladder circuit 40. Thereby, the output reference voltage of the amplifier 12 is set to 0.5*VREF of the normal value. In this case, the output of the amplifier 12 is 0.5*VREF when there is no magnetic field, and G*VH+0.5*VREF when the Hall element 10 generates the Hall voltage VH by detecting a magnetic field.

The Hall IC 100 detects the magnetic field through the two step operation by the spinning current method. At the first step, the switch circuit 11 connects the power source (not shown) between the A-A' terminals of the Hall element 10, based on a control signal supplied from the outside, to feed electricity to the Hall element 10, and connects the terminals B, B' to the amplifier 12. When a magnetic field occurs in a direction passing through the surface of the Hall element 10, a sum of the Hall voltage VH and the offset voltage VOS appears as a Hall element output voltage VOUT1 between the terminals B-B'. That is, at the first step, the Hall element B-B' terminal voltage is $$VOUT1 = VH + VOS \tag{9}$$

The control circuit 20 stores the indicated value 3 Eh corresponding to the reference voltage output terminal of the resistor ladder circuit 40 in the memory 20b, as described above. The decoder 21 reads this indicated value 3 Eh, decodes it to supply a drive signal to drive the switch corresponding to the reference voltage output terminal 3E of the resistor ladder circuit 40 to the selector 30, and drives the switch into ON state. Thereby, (0.5−1/64)*VREF is applied to the additional voltage input terminal Vr of the amplifier 12. That is, the output reference voltage of the amplifier 12 is varied by −1/64*VREF as compared with when there occurs no offset voltage in the Hall element 10. This variation amount −1/64*VREF is equivalent to the offset voltage G*VOS after amplification as shown in the above expression (8) and acts to cancel it. That is, the amplifier output Vamp1 at the first step is $$Vamp1 = (VH+VOS)*G+(0.5-\tfrac{1}{64})*VREF = VH*G + 0.5VREF \tag{10}$$

The amplifier output voltage Vamp1 does not contain the offset voltage component of the Hall element 10, as shown in the above expression (10). The amplifier output voltage is supplied to the A/D converter 13, and outputted as the digital signal.

Subsequently, the switch circuit 11 switches the connection between the Hall element 10 and the amplifier 12 with the power source (not shown) in accordance with a control signal supplied from the outside, and transfers to the second step. That is, the switch circuit 11 connects the power source (not shown) between the B-B' terminals of the Hall element 10 to feed electricity to the Hall element 10, and connects the terminals A, A' to the amplifier 12. When a magnetic field occurs in the direction passing through the surface of the Hall element 10, a difference between the Hall voltage VH and the offset voltage VOS appears as the Hall element output voltage VOUT2 between the terminals A-A'. That is, at the second step, the Hall element A-A' terminal voltage is $$VOUT2 = VH - VOS \tag{11}$$

The control circuit 20 stores the indicated value 00 h corresponding to the reference voltage output terminal of the resistor ladder circuit 40 in the memory 20b as described above. The decoder 21 reads this indicated value 00 h, decodes it to supply a drive signal to drive the switch corresponding to the reference voltage output terminal 00 of the resistor ladder circuit 40 to the selector 30, and drive the switch into ON state. Thereby, $(0.5+1/64)*VREF$ is applied to the additional voltage input terminal Vr of the amplifier 12. That is, the output reference voltage of the amplifier 12 is varied by $+1/64*VREF$ as compared with when there occurs no offset voltage in the Hall element 10. This variation amount $+1/64*VREF$ is equivalent to the offset voltage $-G*VOS$ after amplification as shown in the above expression (8), and acts to cancel it. That is, the amplifier output Vamp2 at the second step is $$Vamp2=(VH-VOS)*G+(0.5+1/64)*VREF=VH+ 0.5VREF \quad (12)$$

The amplifier output voltage Vamp2 does not contain the offset voltage component of the Hall element 10, as shown in the above expression (12). The amplifier output voltage is supplied to the A/D converter 13, and outputted as the digital signal.

Figure 6:
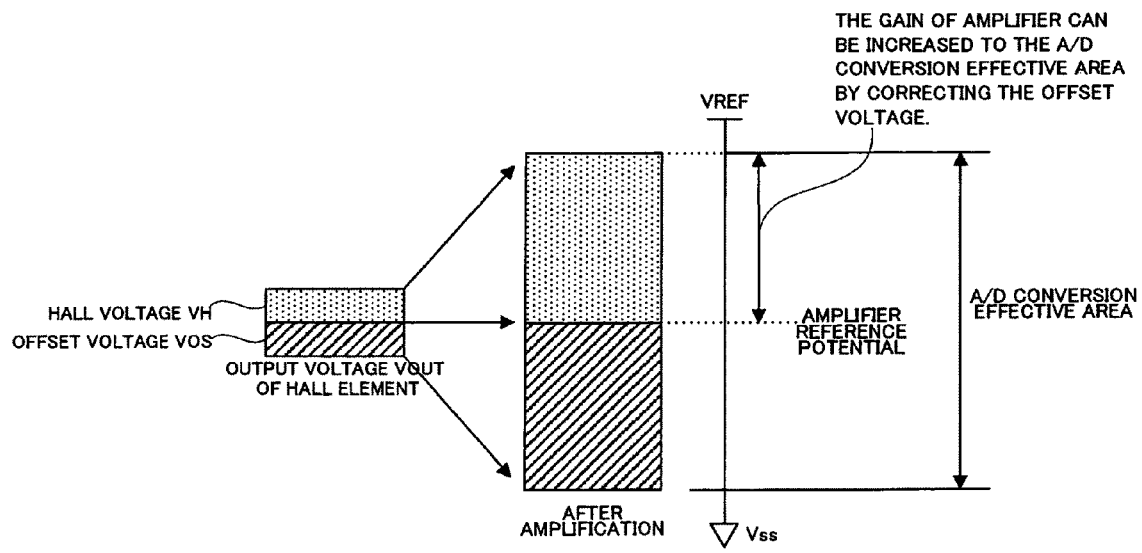
FIG. 6 is a view showing the relationship between the Hall voltage and the A/D conversion effective area in the Hall IC according to the first embodiment of the invention.

In this way, the Hall IC 100 according to the first embodiment of the invention compensates the offset voltage component $VOS*G$ by decreasing the output reference voltage of the amplifier from the normal level $0.5*VREF$ at the first step in the spinning current method, and compensates the offset voltage component $-VOS*G$ by increasing the output reference voltage of the amplifier from the normal level $0.5*VREF$ at the second step. That is, since the polarity of the offset voltage is reversed at the first step and the second step in the spinning current method, the output reference voltage of the amplifier is set at each step, so that the amplifier output with the offset voltage component removed is obtained at each step. Thereby, the amplifier output voltage is kept at $VH*G+0.5*VREF$ without regard to the offset voltage. Since the offset voltage component is excluded from the amplifier output voltage, the gain of the amplifier can be increased to fully use the A/D conversion effective area, whereby the A/D conversion error can be smaller and the magnetic field measurement precision is higher than the conventional configuration where the offset voltage is not removed. FIG. 6 is a view showing the relationship between the Hall voltage and the A/D conversion effective area in the Hall IC according to the embodiment, with the effects of the invention as described above.

Though the magnetic field is detected through the two step operation by the spinning current method in this embodiment, the magnetic field detection by the spinning current method may not be performed, if the offset voltage component can be removed at each step as described above in the embodiment. In this case, the indicated value generation section 20a making up the control circuit 20 as described above selects only the reference voltage output terminal generating the voltage closest to the voltage equivalent to a difference between the normal value of the output reference voltage and the offset voltage $G*VOS$ amplified by the amplifier from among the reference voltage output terminals of the resistor ladder circuit 40, and stores the value corresponding to the selected reference voltage output terminal in the memory 20b. And the amplifier output as shown in the above expression (10) can be obtained by performing only the operation at the first step in the embodiment, and the A/D converter 13 converts such amplifier output into a digital signal, so that the magnetic field can be detected.

Though the offset voltage is fully removed by adjusting the output reference voltage of the amplifier in this embodiment, there is no problem even if the offset voltage component remains in the amplifier output voltage. In this case, like the conventional magnetic field detection by the spinning current method, a memory and an adder circuit are provided at the latter stage of the A/D converter 13, the values outputted from the A/D converter 13 are stored in the memory at the first and second steps, and the adder circuit reads and adds the two signals stored in the memory, so that the output signal not containing the offset voltage component can be obtained. In this case, since a part of the offset voltage component is removed, the amplifier gain can be increased.

Also, though the indicated value generation section 20a takes in an output signal of the A/D converter 13 and acquires an amplifier output voltage converted into a digital signal in accordance with a control signal in the environment where there is no magnetic field, selects the reference voltage output terminal of the resistor ladder circuit 40 based on this amplifier output voltage, and generates the indicated value corresponding to the selected reference voltage output terminal in the above embodiment, any value inputted from the outside may be set as the indicated value. That is, the control circuit 20 does not decide the indicated value, but the value that should be the indicated value may be supplied from the outside, and held. In this case, the control circuit 20 may be an EEPROM, for example, which can hold the indicated value supplied from the outside, and erase and rewrite the storage contents.

Also, means for generating the reference voltage to be applied to the amplifier is not limited to the resistor ladder circuit, but may take any configuration as far as it generates the voltage according to the indicated value.

Second Embodiment

In the Hall IC 100 of the first embodiment, because the offset voltages occurring at the first and second steps of the spinning current method have equal absolute values and mutually different polarities, to remove them, two reference voltage output terminals generating the voltages shifted by the same value in the positive and negative directions around $0.5*VREF$ are selected from among the reference voltage output terminals of the resistor ladder circuit 40, and the indicated values (e.g., 3 Eh and 00 h) corresponding to them are stored in the memory. That is, it is required that two indicated values are stored and read in measuring the magnetic field in the configuration of the first embodiment.

On the contrary, in a Hall IC 200 of the second embodiment, the magnetic field is measured with only one indicated value to reduce the memory capacity. Herein, if the indicated value is only "3 Eh", for example, it is required to output "00 h" based on "3 Eh", in which after making the inverse operation of 3 Eh, it is required to operate −1 (same when 01 h is obtained from 3 Dh). The inverse operation can be configured by an EOR circuit alone, in which it takes little time to make the operation, but it takes a comparatively long operation time to operate −1, so that the magnetic field detection time is longer. In the light of this point, in this embodiment, the magnetic field may be detected by using only one indicated value and without operating −1.

Figure 7:
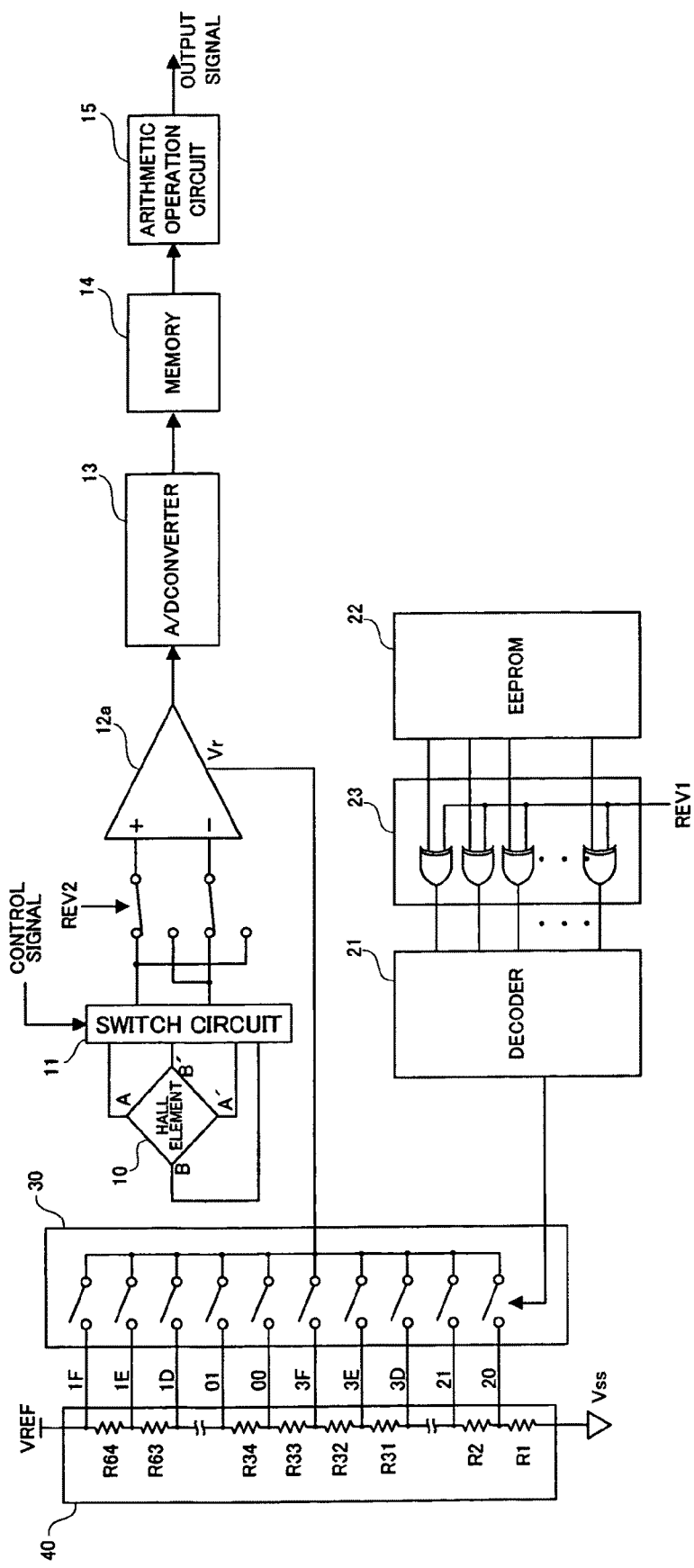
FIG. 7 is a block diagram showing the configuration of a Hall IC according to a second embodiment of the invention.

FIG. 7 shows the configuration of the Hall IC 200 according to the second embodiment of the invention. In the Hall IC 200 according to the second embodiment, the control circuit 20 is replaced with an EEPROM 22, and an inverting circuit 23 is provided between the EEPROM 22 and the decoder 21, unlike the configuration of the first embodiment. Also, the amplifier 12 is replaced with a chopper amplifier 12a. The inverting circuit 23 and the chopper amplifier 12a are controlled by the inverse signals REV1 and REV2, respectively. Further, a memory 14 for storing the output signal of the A/D converter 13 and an arithmetic operation circuit 15 for performing a predetermined arithmetic operation process for the indicated value held in the memory 14 are added.

The inverting circuit 23, which is composed of a plurality of EOR circuits connected in parallel, performs the inverse operation on the value stored in the EEPROM 22 according to an inverse signal REV1, and outputs the operation result to the decoder 21. Specifically, the inverting circuit 23 directly outputs the indicated value without making the inverse operation on the indicated value held in the EEPROM 22, if the signal level of the inverse signal REV1 is "0", or outputs the inverted value of the indicated value held in the EEPROM 22, if the signal level of the inverse signal REV1 is "1". For example, if the indicated value of the EEPROM 22 is "3 Eh", this value is represented as "111110" in binary notation. Each of the EOR circuits making up the inverting circuit 23 corresponds to each bit of the indicated value represented in binary notation. If "0" is inputted as the inverse signal REV1, the "111110"="3 Eh" is directly outputted without inverting the indicated value held in the EEPROM 22. On the other hand, the inverting circuit 23 outputs "000001"="01 h" by inverting the digit level of each bit of the indicated value represented in binary notation, if "1" is inputted as the inverse signal REV1.

The chopper amplifier 12a inverts the input voltage according to an inverse signal REV2. Specifically, the chopper amplifier 12a directly receives a Hall element output voltage VOUT supplied via the switch circuit 11, if the signal level of the inverse signal REV2 is "0", or exchanges the voltages supplied to the non-inverse input terminal and the inverse input terminal of the chopper amplifier 12a, if the signal level of the inverse signal REV2 is "1". That is, in this case, −VOUT is supplied as the input voltage to the chopper amplifier 12a.

Figure 8:
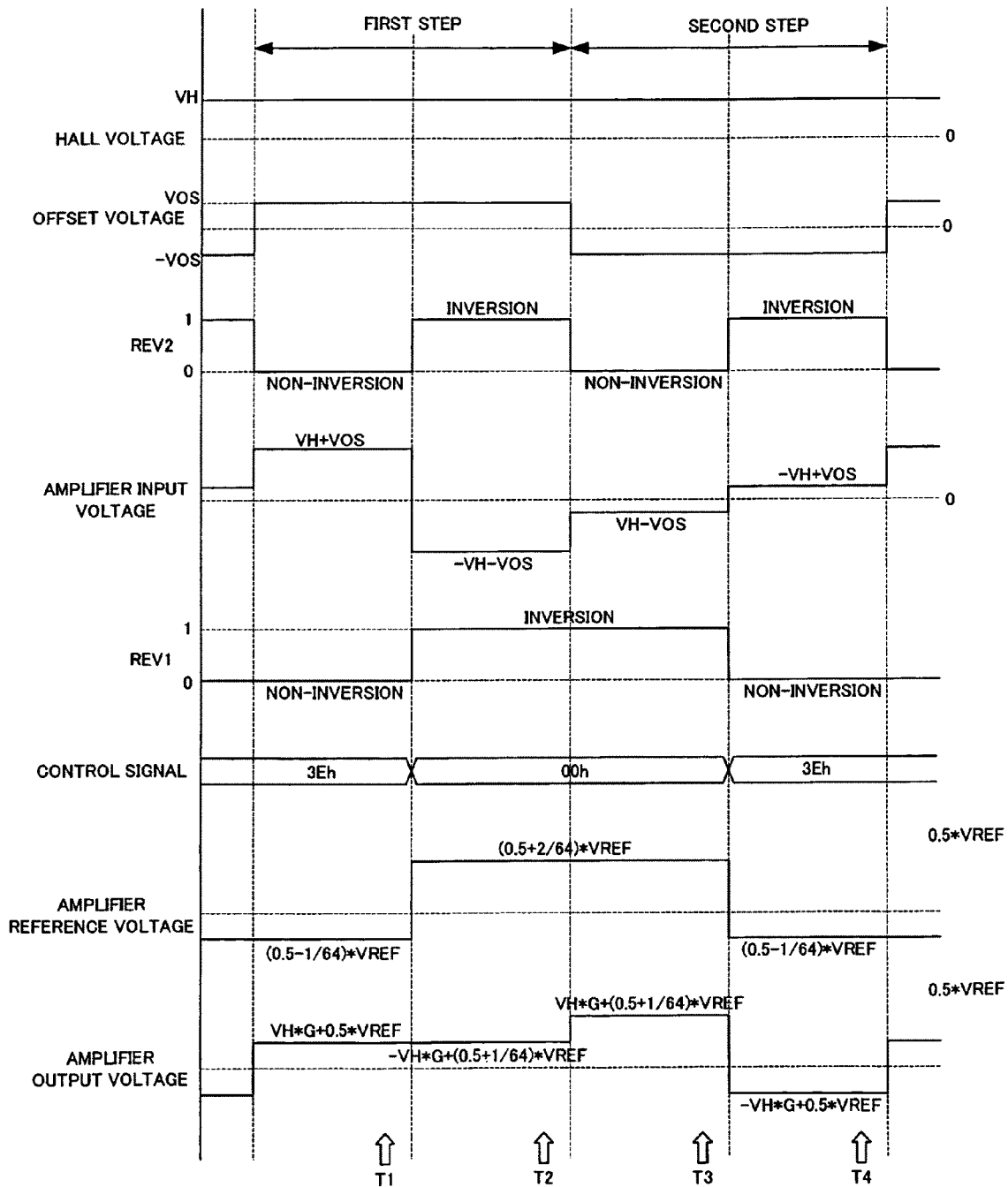
FIG. 8 is a timing chart showing the operation of the Hall IC according to the second embodiment of the invention.

Referring to a timing chart of FIG. 8, the operation of the Hall IC 200 according to the second embodiment will be described below. In the following description, it is supposed that $$G*VOS=\frac{1}{64}*VREF \qquad (13)$$

and the EEPROM 22 holds prewritten "3Eh" as the indicated value to remove the offset voltage VOS*G after amplification.

The Hall IC 200 of the invention detects the magnetic field through the two step operation by the spinning current method. At the first step, the switch circuit 11 connects a power source (not shown) between the A-A' terminals of the Hall element 10, based on a control signal supplied from the outside, to feed electricity to the Hall element 10, and connects the terminals B, B' of the Hall element 10 to the amplifier 12. When a magnetic field occurs in a direction passing through the surface of the Hall element 10, a sum of the Hall voltage VH and the offset voltage VOS appears as the Hall element output voltage VOUT1 between the terminals B-B'. That is, at the first step, the Hall element B-B' terminal voltage is $$VOUT1=VH+VOS \qquad (14).$$

In the former half of the first step, "0" (non-inversion) is supplied as the inverse signals REV1 and REV2 to the inverting circuit 23 and the chopper amplifier 12a, respectively. Thereby, the Hall element output voltage VOUT is directly inputted into the chopper amplifier 12a, and the inverting circuit 23 directly supplies the indicated value "3Eh" held in the EEPROM 22 to the decoder 21. The decoder 21 decodes the received indicated value 3Eh to supply a drive signal to drive the switch corresponding to the reference voltage output terminal 3E of the resistor ladder circuit 40 to the selector 30, and drives the switch into ON state. Thereby, $(0.5-\frac{1}{64})*VREF$ is applied to the additional voltage input terminal Vr of the chopper amplifier 12a. That is, the output reference voltage of the chopper amplifier 12a is varied by $-\frac{1}{64}*VREF$ as compared with when there occurs no offset voltage in the Hall element 10. This variation amount $-\frac{1}{64}*VREF$ is equivalent to the offset voltage G*VOS after amplification as shown in the above expression (13), and acts to cancel it. That is, the amplifier output Vamp1 in the former half of the first step is $$Vamp1=(VH+VOS)*G+(0.5-\tfrac{1}{64})*VREF=VH*G+0.5VREF \qquad (15).$$

Such amplifier output is A/D converted by the A/D converter 13 at the T1 timing during the period in the former half of the first step, and stored in the memory 14.

Subsequently, in the latter half of the first step, "1" (inversion) is supplied as the inverse signals REV1 and REV2 to the inverting circuit 23 and the chopper amplifier 12a, respectively. Thereby, the Hall element output voltage VOUT is inverted and −VOUT is inputted into the chopper amplifier 12a, and the inverting circuit 23 supplies the value "01 h" in which the indicated value "3 Eh" held in the EEPROM 22 is inverted to the decoder 21. The decoder 21 decodes the received indicated value 01h to supply a drive signal to drive the switch corresponding to the reference voltage output terminal 01 of the resistor ladder circuit 40 to the selector 30, and drives the switch into ON state. Thereby, $(0.5+\frac{2}{64})*VREF$ is applied to the additional voltage input terminal Vr of the chopper amplifier 12a. That is, the output reference voltage of the chopper amplifier 12a is varied by $+\frac{2}{64}*VREF$ as compared with when there occurs no offset voltage in the Hall element 10. A voltage $+\frac{1}{64}*VREF$ that is half of this variation amount $+\frac{2}{64}*VREF$ is equivalent to the offset voltage −G*VOS after amplification as shown in the above expression (13), and acts to cancel it. That is, the amplifier output Vamp2 in the latter half of the first step is $$Vamp2 = -(VH+VOS)*G+(0.5+2/64)*VREF \qquad (16)$$
$$= -VH*G+(0.5+1/64)VREF.$$

Such amplifier output is A/D converted by the A/D converter 13 at the T2 timing during the period in the latter half of the first step, and stored in the memory 14.

Next, the switch circuit 11 switches the connection between the Hall element 10 and the chopper amplifier 12a with the power source (not shown) in accordance with a control signal supplied from the outside and transfers to the second step. That is, the switch circuit 11 connects the power source (not shown) between the B-B' terminals of the Hall element 10 to feed electricity to the Hall element 10, and connects the terminals A, A' of the Hall element 10 to the chopper amplifier 12a. When a magnetic field occurs in a direction passing through the surface of the Hall element 10, a difference between the Hall voltage VH and the offset voltage VOS appears as the Hall element output voltage VOUT2 between the terminals A-A'. That is, at the second step, the Hall element A-A' terminal voltage is $$VOUT2=VH-VOS \qquad (17)$$

In the former half of the second step, "1" (inversion) as the inverse signal REV1 and "0" (non-inversion) as the inverse signal REV2 are supplied to the inverting circuit 23 and the chopper amplifier 12a, respectively. Thereby, the Hall element output voltage VOUT is directly inputted into the chopper amplifier 12a, and the inverting circuit 23 supplies the value "01 h" in which the indicated value "3Eh" held in the EEPROM 22 is inverted to the decoder 21. The decoder 21 decodes the received indicated value 01 h to supply a drive signal to drive the switch corresponding to the reference voltage output terminal O1 of the resistor ladder circuit 40 to the selector 30, and drives the switch into ON state. Thereby, $(0.5+2/64)*VREF$ is applied to the additional voltage input terminal Vr of the chopper amplifier 12a. That is, the output reference voltage of the chopper amplifier 12a is varied by $2/64*VREF$ as compared with when there occurs no offset voltage in the Hall element 10. A voltage $1/64*VREF$ that is half of this variation amount $2/64*VREF$ is equivalent to the offset voltage $-G*VOS$ after amplification as shown in the above expression (13), and acts to cancel it. That is, the amplifier output Vamp3 in the former half of the second step is $$Vamp3=(VH-VOS)*G+(0.5+2/64)*VREF=VH*G+(0.5+1/64)VREF \quad (18)$$

Such amplifier output is A/D converted by the A/D converter 13 at the T3 timing during the period in the former half of the second step, and stored in the memory 14.

Subsequently, in the latter half of the second step, "0" (non-inversion) as the inverse signals REV1 and "1" (inversion) as the inverse signal REV2 are supplied to the inverting circuit 23 and the chopper amplifier 12a, respectively. Thereby, the Hall element output voltage is inverted and −VOUT is inputted into the chopper amplifier 12a, and the inverting circuit 23 directly supplies the indicated value "3 Eh" held in the EEPROM 22 to the decoder 21. The decoder 21 decodes the received indicated value 3 Eh to supply a drive signal to drive the switch corresponding to the reference voltage output terminal 3E of the resistor ladder circuit 40 to the selector 30, and drives the switch into ON state. Thereby, the reference voltage output terminal 3E is connected to the additional voltage input terminal Vr of the chopper amplifier 12a and $(0.5−1/64)*VREF$ is applied to it. That is, the output reference voltage of the chopper amplifier 12a is varied by $−1/64*VREF$ as compared with when there occurs no offset voltage in the Hall element 10. This variation amount $−1/64*VREF$ is equivalent to the offset voltage $G*VOS$ after amplification as shown in the above expression (13), and acts to cancel it. That is, the amplifier output Vamp4 in the latter half of the second step is $$Vamp4 = -(VH - VOS)*G + (0.5 - 1/64)*VREF \quad (19)$$
$$= VH*G + 0.5VREF.$$

Such amplifier output is A/D converted by the A/D converter 13 at the T4 timing during the period in the latter half of the second step, and stored in the memory 14.

Next, the arithmetic operation circuit 15 reads the amplifier outputs Vamp1 to Vamp4 obtained at each step from the memory 14 and performs the following arithmetic operation to obtain the final output voltage V.

$$V=Vamp1-Vamp2+Vamp3-Vamp4=4VH*G+0.5*VREF \quad (20)$$

The output voltage V does not contain the offset voltage component of the Hall element 10, as shown in the above expression (20).

In this way, the Hall IC according to the second embodiment uses only one indicated value held in the EEPROM to remove the offset voltage without performing −1 operation, whereby the memory capacity is reduced and the magnetic field detection time is shortened. Also, since it is not required that the resistor ladder circuit outputs the voltages shifted by the same value in the positive and negative directions around 0.5*VREF, it is possible to reduce the number of divided resistors for the resistor ladder circuit. Also, since the voltage precision is not required, the resistor area of the resistor ladder circuit can be reduced.

Third Embodiment

Figure 9:
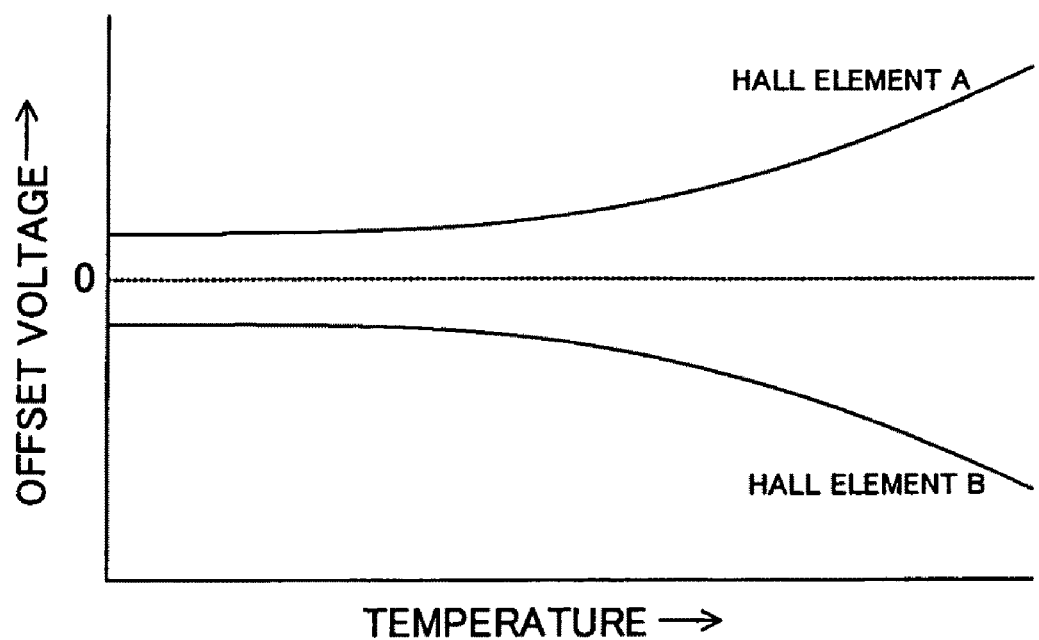
FIG. 9 is a diagram showing the temperature characteristic of the offset voltage for the Hall elements.

FIG. 9 is a graph showing the temperature characteristic of the offset voltage when the Hall element is driven at constant current. As shown in FIG. 9, the offset voltage contained in the Hall element output voltage has the temperature characteristic of a quadratic function, in which it is required to correct this to detect the magnetic field at high precision. A Hall IC 300 according to the third embodiment has means for correcting the temperature characteristic of the offset voltage for the Hall element.

Figure 10:
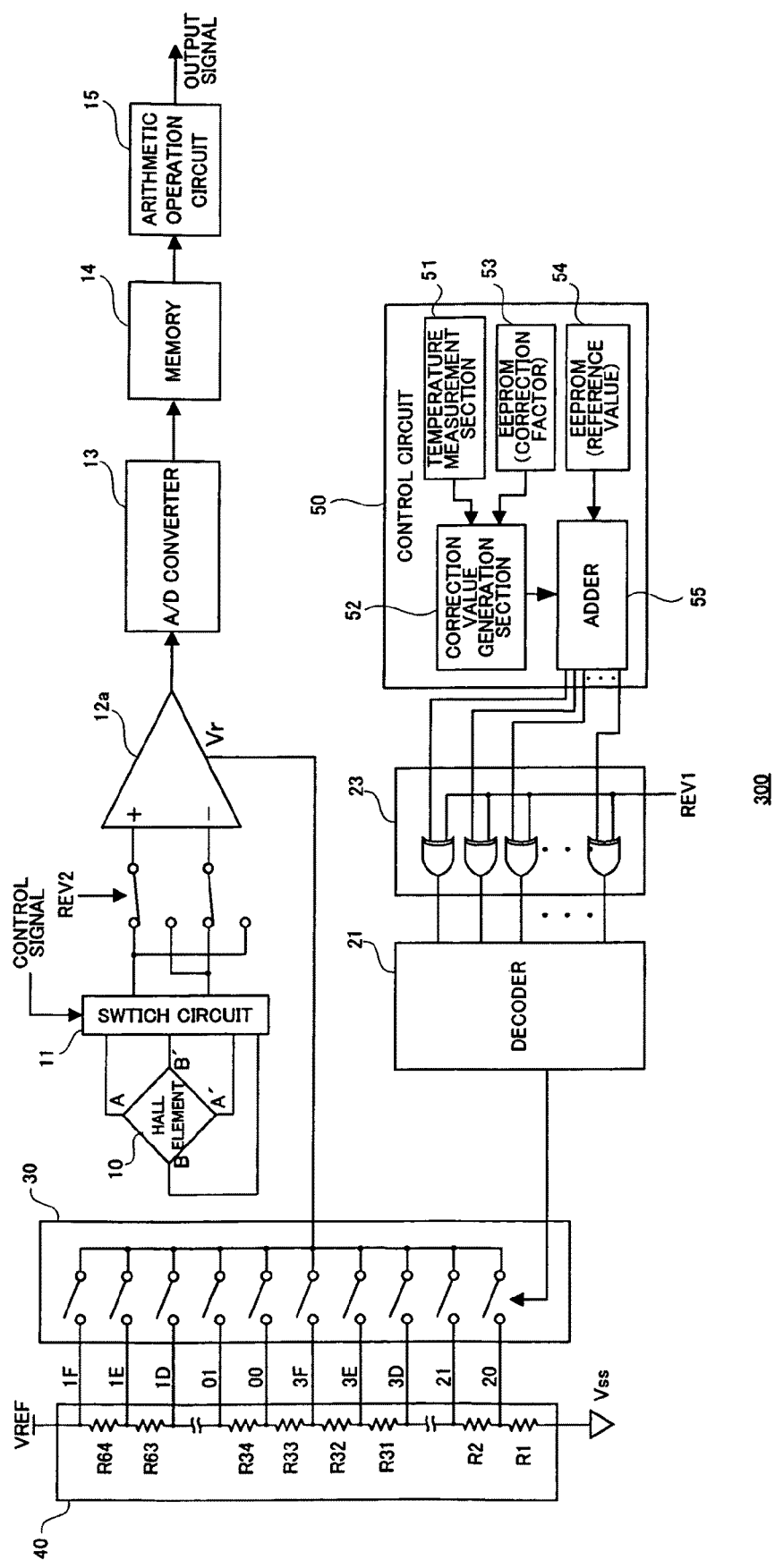
FIG. 10 is a block diagram showing the configuration of a Hall IC according to a third embodiment of the invention.

FIG. 10 is a block diagram showing the configuration of the Hall IC 300 according to this embodiment. In the Hall IC 300 according to the third embodiment, the EEPROM 22 is replaced with a control circuit 50, as compared with the configuration of the second embodiment. The control circuit 50 comprises a temperature measurement section 51, a correction value generation section 52, the EEPROMs 53 and 54, and an adder 55.

The temperature measurement section 51 comprises a temperature sensor and an A/D converter to measure the ambient temperature at a resolution of 0.004 [degC./bit], and outputs a temperature detection signal in two's compliment number of 16 bits in a temperature range from −106 to 156 degC. FIG. 11 shows a part of the correspondence between the measured temperature by the temperature measurement section 51 and the temperature detection signal (hexadecimal notation).

The EEPROM 53 holds the temperature characteristic correction factor (coefficient) of any of −3, −2, −1, 0, 1, 2 and 3. The temperature characteristic correction factor is the value decided in accordance with the temperature characteristic of the offset voltage that is different for each Hall element, in which any of the above values most suitable for the temperature characteristic correction of the offset voltage for the Hall element 10 is written into the EEPROM 53 and held.

The correction value generation section 52 outputs the correction value from the temperature detection signal supplied from the temperature measurement section 51 and the temperature characteristic correction factor held in the EEPROM 53 in accordance with a table of truth value as shown in FIG. 12. That is, the correction value generation section 52 decodes the upper four bits of the temperature detection signal of 16 bits, identifies a temperature range of 16.375 degC., and outputs the correction value according to the temperature characteristic factor by referring to the table of truth value for each identified temperature range.

The EEPROM 54 holds the indicated value corresponding to the reference voltage output terminal of the resistor ladder circuit 40 generating the voltage equivalent to the reference value to set the output reference voltage of the chopper amplifier 12a before the temperature characteristic correction as the reference value. Such indicated value is decided depending on the offset voltage of the Hall element 10 near 25 degC., for example.

The adder 55 supplies the value obtained by adding the indicated value stored in the EEPROM 54 and the correction value supplied from the correction value generation section 52 as the indicated value after the temperature characteristic correction to the decoder 21.

Figure 13:
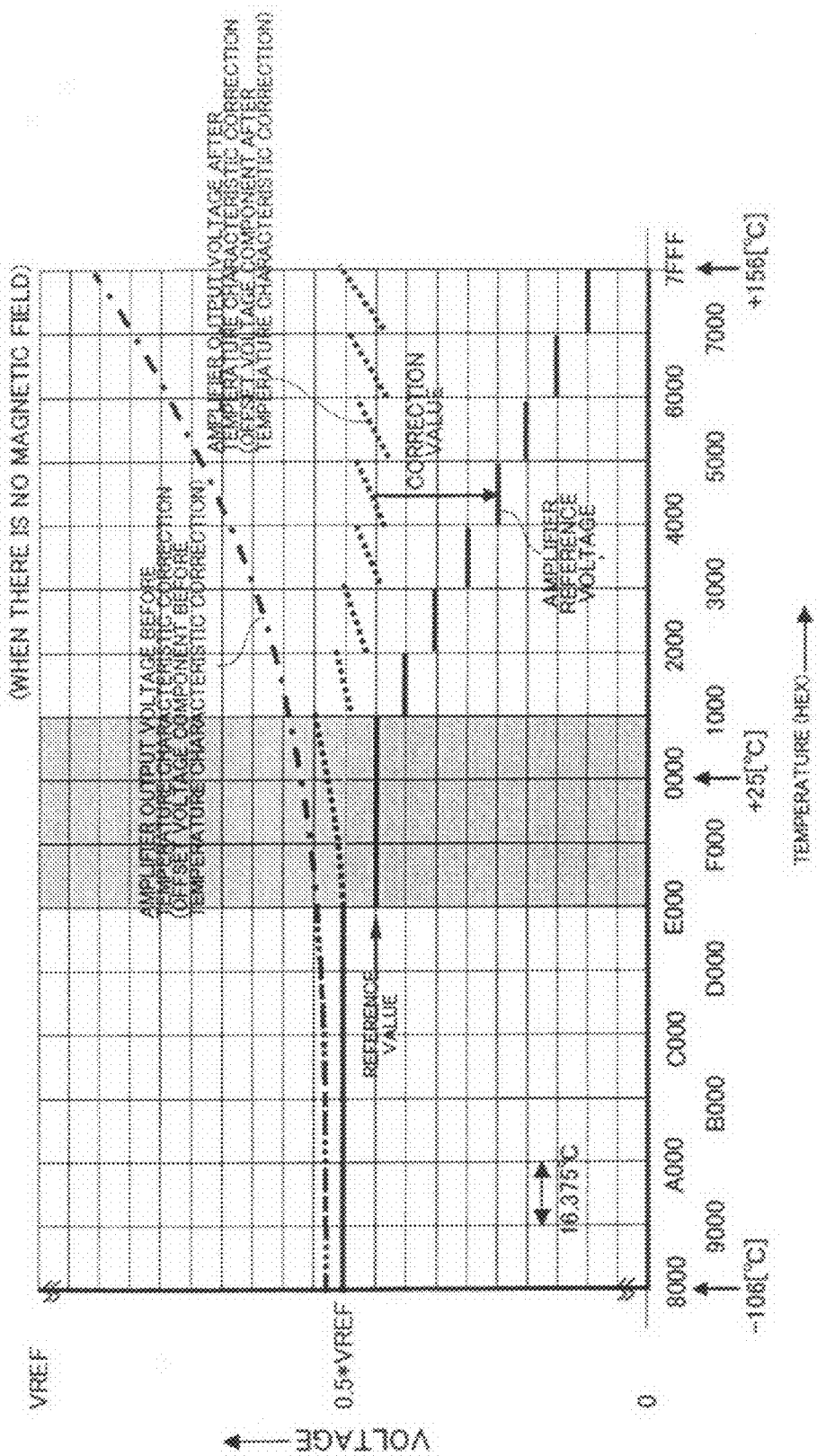
FIG. 13 is a graph showing the relationship between the ambient temperature and the amplifier reference voltage and the amplifier output voltage in a Hall IC according to a third embodiment of the invention.

FIG. 13 is a graph showing the output reference voltage and the output voltage of the chopper amplifier 12a that changes depending on the ambient temperature for the Hall IC 300 according to this embodiment, and showing a specific mode of the temperature characteristic correction for the offset voltage with the Hall IC 300. In the graph of FIG. 13, the horizontal axis represents the ambient temperature, and the vertical axis represents the voltage. It is supposed that the magnetic field does not occur, and the amplifier output voltage does not contains the Hall voltage component. Referring to the graph of FIG. 13, the temperature characteristic correction for the Hall IC 300 will be described below.

In the graph of FIG. 13, a curve indicated by the alternate long and short dashed line is the output voltage of the chopper amplifier 12a when there is no magnetic field. That is, this curve is the offset voltage component before the temperature characteristic correction for the Hall element 10. If the Hall element 10 has such temperature characteristic of the offset voltage, the Hall element output voltage rises along with the rise in temperature, though the intensity of magnetic field is constant, whereby the magnetic field detection at high precision can not be made. The Hall IC 300 according to this embodiment corrects for this rise in the offset voltage component due to the temperature characteristic by changing the output reference voltage of the chopper amplifier 12a depending on the ambient temperature.

The EEPROM 53 can have any value written from the outside, in which the value selected to remove the offset voltage component of the Hall element 10 having the temperature characteristic as shown in the graph of FIG. 13 is held as the temperature characteristic correction factor. In the following description, it is supposed that the temperature characteristic correction factor of "−1" is held in the EEPROM 53.

The correction value generation section 52 outputs the correction value from the temperature detection signal supplied from the temperature measurement section 51 and the temperature characteristic correction factor of "−1" stored in the EEPROM 53 by referring to the table of truth value as shown in FIG. 12. That is, the correction value generation section 52 decodes the upper four bits of the temperature detection signal of 16 bits supplied from the temperature measurement section 51, identifies a temperature range of 16.375 degC., and outputs the correction value according to the correction factor for each identified temperature range. For example, the correction value generation section 52 outputs the correction value "1", if the upper four bits of the temperature detection signal is in the range from 8h to Dh in accordance with the table of truth value, outputs the correction value "−1", if the upper four bits of the temperature detection signal is 1 h, or outputs the correction value "−7", if the upper four bits of the temperature detection signal is 7 h. Also, the correction value generation section 52 outputs the correction value "0", if the upper four bits of the temperature detection signal is in the range from Eh to 0 h, irrespective of the temperature characteristic correction factor. That is, in this case, the temperature characteristic is not corrected. In this way, the correction value generation section 52 outputs the correction value that is different depending on a change in the ambient temperature.

The EEPROM 54 holds the indicated value corresponding to the reference voltage output terminal of the resistor ladder circuit 40 generating the voltage equivalent to the reference value to set the output reference voltage of the chopper amplifier 12a before the temperature characteristic correction as the reference value. Such indicated value is the value decided to remove the offset voltage component when the ambient temperature is near 25 degC., for example. In this embodiment, "3 Eh" is held in the EEPROM 54.

The adder 55 adds the correction value supplied from the correction value generation section 52 to the value "3 Eh" held in the EEPROM 54. Herein, when the ambient temperature is in the range from E000 h to 0 FFFh, the correction value "0" is supplied from the correction value generation section 52, whereby the adder 55 makes the arithmetic operation of 3 E+0, outputs 3 Eh, and supplies it via the inverting circuit 23 to the decoder 21. That is, when the ambient temperature is near 25 degC., the temperature characteristic is not corrected, and the adder 55 directly outputs 3 Eh that is the value corresponding to the reference value stored in the EEPROM 54. Thereby, the switch corresponding to the reference voltage output terminal 3E of the resistor ladder circuit 40 is driven ON, so that the output reference voltage of the chopper amplifier 12a becomes (0.5−1/64)*VREF to remove the offset voltage component as in the second embodiment.

Also, when the ambient temperature is in the range from 8000h to DFFFh, the correction value "1" is supplied from the correction value generation section 52, whereby the adder 55 makes the arithmetic operation of 3 E+1, outputs 3Fh, and supplies it via the inverting circuit 23 to the decoder 21. Thereby, the switch corresponding to the reference voltage output terminal 3F of the resistor ladder circuit 40 is driven ON, so that the output reference voltage of the chopper amplifier 12a becomes 0.5*VREF. That is, when the ambient temperature is in the range from 8000 h to DFFFh, the output reference voltage of the chopper amplifier 12a rises by 1/64*VREF from the reference value of (0.5−1/64)*VREF to correct the offset voltage component that is decreased due to the temperature characteristic.

Also, when the ambient temperature is in the range from 1000 h to 1 FFFh, the correction value "−1" is supplied from the correction value generation section 52, whereby the adder 55 makes the arithmetic operation of 3E+(−1), outputs 3 Dh, and supplies it via the inverting circuit 23 to the decoder 21. Thereby, the switch corresponding to the reference voltage output terminal 3D of the resistor ladder circuit 40 is driven ON, so that the output reference voltage of the chopper amplifier 12a becomes (0.5−2/64)*VREF. That is, when the ambient temperature is in the range from 1000 h to 1 FFFh, the output reference voltage of the chopper amplifier 12a falls by 1/64*VREF from the reference value of (0.5−1/64)*VREF to correct the offset voltage component that is increased due to the temperature characteristic.

Also, when the ambient temperature is in the range from 7000 h to 7 FFFh, the correction value "−7" is supplied from the correction value generation section 52, whereby the adder 55 makes the arithmetic operation of 3 E+(−7), outputs 27 h, and supplies it via the inverting circuit 23 to the decoder 21. Thereby, the switch corresponding to the reference voltage output terminal 27 of the resistor ladder circuit 40 is driven ON, so that the output reference voltage of the chopper amplifier 12a becomes (0.5−8/64)*VREF. That is, when the ambient temperature is in the range from 7000 h to 7 FFFh, the output reference voltage of the chopper amplifier 12a falls by 7/64*VREF from the reference value of (0.5−1/64)*VREF to correct the offset voltage component that is increased due to the temperature characteristic. The third embodiment is the same as the second embodiment, except that the output reference voltage of the amplifier is changed depending on the ambient temperature.

In this way, the Hall IC 300 according to this embodiment increases or decreases the output reference voltage of the amplifier from the reference value in each predetermined temperature range in accordance with the temperature characteristic of the offset voltage for the Hall element, to compensate a variation amount of the offset voltage due to the temperature characteristic, so that the output voltage of the amplifier when there is no magnetic field is kept roughly at 0.5*VREF, thereby achieving the temperature characteristic correction of the offset voltage for the Hall element. Also, with the Hall IC 300 according to this embodiment, the temperature characteristic of the offset voltage given by the quadratic function is corrected without making the quadratic function operation, whereby it is possible to shorten the magnetic field measurement time and reduce the circuit scale.

Fourth Embodiment

The Hall element 10 has the property that if the offset voltage takes the positive value, the offset voltage increases in the positive direction as the temperature rises, while if the offset voltage takes the negative value, the offset voltage increases in the negative direction as the temperature rises as shown in FIG. 9. That is, in the same Hall element, the offset voltage is not varied from the positive value to the negative value, or from the negative value to the positive value, in which the polarity of the offset voltage is kept constant. A Hall element IC 400 according to a fourth embodiment has a modified configuration of the third embodiment, using the characteristics of the offset voltage for such Hall element.

Figure 14:
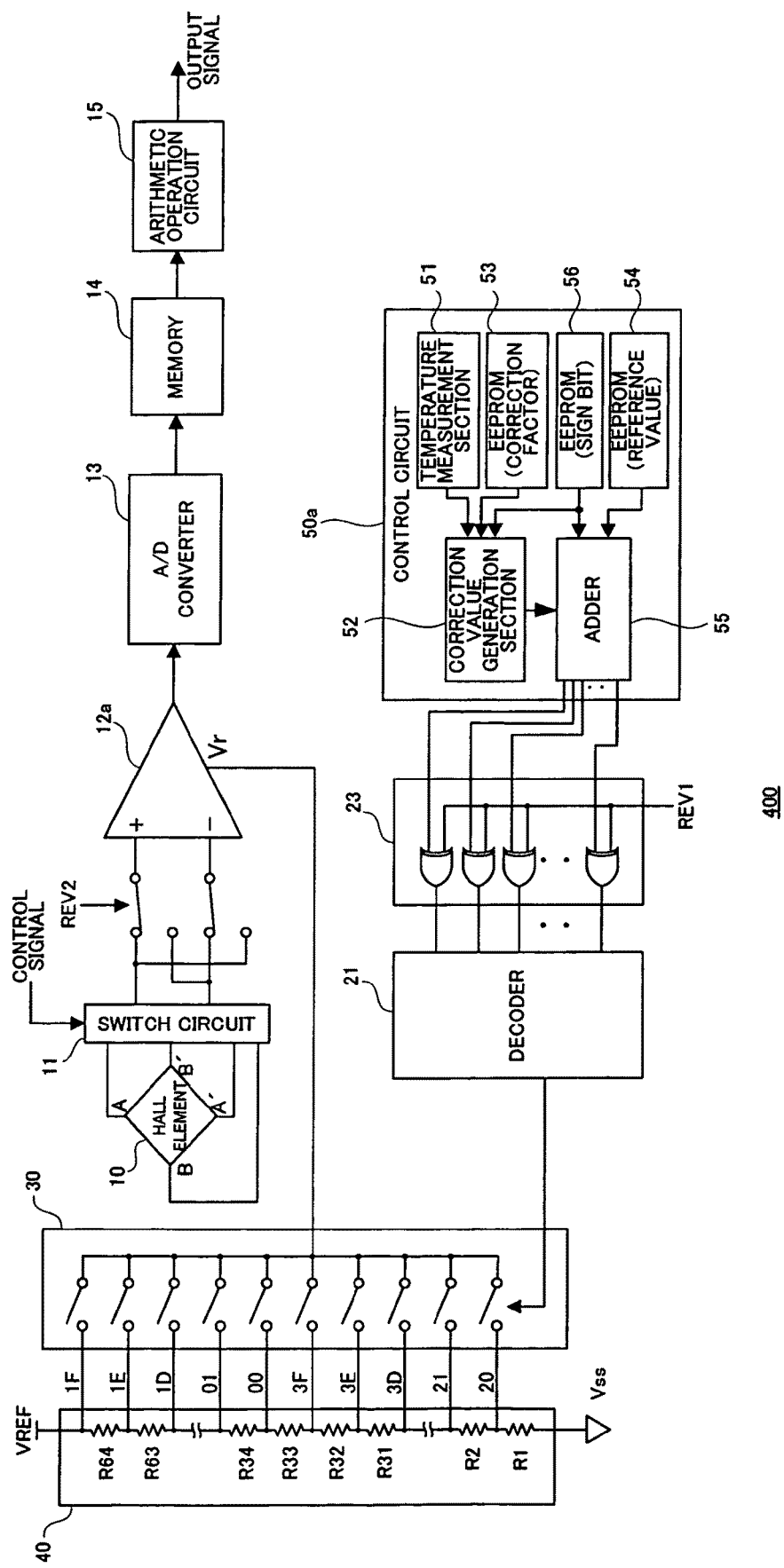
FIG. 14 is a block diagram showing the configuration of a Hall IC according to a fourth embodiment of the invention.

FIG. 14 is a block diagram showing the configuration of the Hall IC 400 according to the fourth embodiment. The Hall IC 400 is different in the configuration of a control section from the configuration of the third embodiment. Though the temperature characteristic correction factor is stored in the EEPROM 53 for the Hall IC 300 according to the third embodiment, and the value corresponding to the reference voltage output terminal generating the reference value of the output reference voltage for the amplifier is stored in the EEPROM 54, when these values are represented in binary notation, the most significant bit functions as a sign bit, and both the sign bits always take the same value from the characteristic of the offset voltage for the Hall element as described above. For example, when the offset voltage of the Hall element is positive, the offset voltage has the positive temperature characteristic, whereby the temperature characteristic correction factor to be stored in the EEPROM 53 has a negative value. Also, when the offset voltage of the Hall element is positive, the output reference voltage of the amplifier is set in a direction of decreasing from the normal value 0.5*VREF, and the value to be stored in the EEPROM 54 can be considered as the negative value.

Thus, in a control circuit 50a of the Hall IC 400 according to the fourth embodiment, a new EEPROM 56 is provided, whereby the sign bit used commonly to the values held in the EEPROM 53 and 54 is stored in the EEPROM 56. Along with this, each of the values held in the EEPROM 53 and 54 is reduced by one bit.

The correction value generation section 52 generates the temperature characteristic correction factor from the value having no sign bit stored in the EEPROM 53 and the sign bit stored in the EEPROM 56, and outputs the correction value by referring to the table of truth value as shown in FIG. 12, based on this temperature characteristic correction factor and a temperature detection signal supplied from the temperature measurement section 51. The adder 55 generates a value corresponding to the reference value of the output reference voltage for the amplifier from the value having no sign bit stored in the EEPROM 54 and the sign bit stored in the EEPROM 56, and adds this value and the correction value supplied from the correction value generation section to output the added value as the indicated value.

In this way, the Hall IC 400 according to the fourth embodiment is separately provided with the memory storing the sign bit used commonly to the values stored in the EEPROM 53 and 54, whereby the memory capacities of the EEPROM 53 and 54 can be reduced.

What is claimed is:

1. A magneto-sensitive integrated circuit comprising:
    a Hall element which generates a magneto-sensitive output voltage corresponding to a magnetic flux density of an applied magnetic field;
    an amplifier which amplifies the magneto-sensitive output voltage to generate an amplified voltage;
    an A/D converter which converts an output voltage of said amplifier into a digital signal; and
    a controller which generates a reference voltage of magnitude corresponding to an indicated value,
    wherein said amplifier includes voltage superposition means for superposing a DC voltage corresponding to the reference voltage on the amplified voltage to generate the output voltage of said amplifier, and
    wherein said controller includes
        a resistor ladder circuit having a plurality of resistors connected in series,
        a power source for supplying a voltage across said resistor ladder circuit,
        a plurality of reference voltage output terminals, connected to each end of said resistors, for outputting a voltage divided by each of said resistors,
        a first memory which holds the indicated value,
        a plurality of switches corresponding to each of said reference voltage output terminals and provided between said reference voltage output terminals and an additional voltage input terminal of said amplifier, and
        a decoder which selectively drives said switches based on the indicated value held in said memory,
        said controller applies as the reference voltage one of a plurality of mutually different voltages to said voltage superposition means by connecting a reference voltage output terminal corresponding to the indicated value to said additional voltage input terminal of said amplifier.

2. The magneto-sensitive integrated circuit according to claim 1, wherein said first memory has stored contents writable or erasable by an external input.

3. The magneto-sensitive integrated circuit according to claim 1, wherein said controller further comprises an indicated value generator which acquires the output voltage of said amplifier from an output signal of said A/D converter in accordance with a control signal, and generates as the indicated value a voltage corresponding to the acquired output voltage of said amplifier.

4. The magneto-sensitive integrated circuit according to claim 3, wherein said indicated value generator generates the indicated value as the value corresponding to one of the plurality of mutually different voltages, the one of the plurality of mutually different voltages being a voltage closest to a voltage value obtained by subtracting a voltage value equivalent to the acquired output voltage of said amplifier from a voltage corresponding to a normal value of the indicated value.

5. The magneto-sensitive integrated circuit according to claim 1, wherein said controller changes the indicated value in accordance with an ambient temperature.

6. The magneto-sensitive integrated circuit according to claim 1, wherein said controller further comprises a first section which obtains as an offset voltage the output voltage of said amplifier when there is no magnetic field, and a second section which generates the indicated value corresponding to a voltage value obtained by subtracting the offset voltage from a voltage corresponding to a normal value of the indicated value.

7. A magneto-sensitive integrated circuit comprising:
a Hall element which generates a magneto-sensitive output voltage corresponding to a magnetic flux density of an applied magnetic field;
an amplifier which amplifies the magneto-sensitive output voltage to generate an amplified voltage;
an A/D converter which converts an output voltage of said amplifier into a digital signal; and
a controller which generates a reference voltage of magnitude corresponding to an indicated value,
wherein said amplifier includes voltage superposition means for superposing a DC voltage corresponding to the reference voltage on the amplified voltage to generate the output voltage of said amplifier, and
wherein said controller comprises a temperature measurement section which outputs a temperature detection signal in accordance with an ambient temperature, a first memory which holds a correction factor, a correction value generation section which generates a correction value based on the temperature detection signal and the correction factor, and a section which newly generates the indicated value based on the correction value and the indicated value.

8. A magneto-sensitive integrated circuit comprising:
a Hall element which generates a magneto-sensitive output voltage corresponding to a magnetic flux density of an applied magnetic field;
an amplifier which amplifies the magneto-sensitive output voltage to generate an amplified voltage;
an A/D converter which converts an output voltage of said amplifier into a digital signal; and
a controller which generates a reference voltage of magnitude corresponding to an indicated value,
wherein said amplifier includes voltage superposition means for superposing a DC voltage corresponding to the reference voltage on the amplified voltage to generate the output voltage of said amplifier, and
wherein said Hall element has first to fourth terminals for input and output voltage terminals,
said integrated circuit further comprises a switch circuit which switches from a first step of applying a output voltage of a power source between said first and second terminals and of obtaining as the magneto-sensitive output voltage a voltage between said third and fourth terminals, to a second step of applying the output voltage of said power source between said third and fourth terminals and of obtaining as the magneto-sensitive output voltage a voltage between said first and second terminals, and
said controller further comprises a first section which obtains as an offset voltage the output voltage of said amplifier when there is no magnetic field, and an indicated value generator which generates the indicated value corresponding to a voltage value obtained by subtracting the offset voltage from a voltage corresponding to a normal value of the indicated value in the first step, and generates the indicated value corresponding to a voltage value obtained by adding the offset voltage to a voltage corresponding to the normal value of the indicated value in the second step.

9. The magneto-sensitive integrated circuit according to claim 8, wherein an output voltage of said amplifier in the first step and an output voltage of said amplifier in the second step are added to obtain a final magneto-sensitive output voltage.

10. The magneto-sensitive integrated circuit according to claim 8, wherein said controller has an arithmetic operation circuit which outputs as the indicated value a predetermined value held in a memory in a former half of a period of the first step and a latter half of a period of the second step, and outputs the indicated value by performing an inverse operation on the predetermined value in a latter half of the first step period and a former half of the second step period, and
a voltage obtained by subtracting from an output voltage of said amplifier in the former half of the first step period to an output voltage of said amplifier in the latter half of the first step period and a voltage obtained by subtracting from an output voltage of said amplifier in the former half of the second step period to an output voltage of said amplifier in the latter half of the second step period are added to obtain a final magneto-sensitive output voltage.

* * * * *